(12) United States Patent
Sharma et al.

(10) Patent No.: US 11,711,089 B2
(45) Date of Patent: Jul. 25, 2023

(54) SAR ADC WITH ALTERNATING LOW AND HIGH PRECISION COMPARATORS AND UNEVEN ALLOCATION OF REDUNDANCY

(71) Applicant: Telefonaktiebolaget LM Ericsson (publ), Stockholm (SE)

(72) Inventors: Sunny Sharma, Malmö (SE); Lars Sundström, Lund (SE); Bengt Erik Jonsson, Delsbo (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 132 days.

(21) Appl. No.: 17/599,637

(22) PCT Filed: Apr. 5, 2019

(86) PCT No.: PCT/EP2019/058701
§ 371 (c)(1),
(2) Date: Sep. 29, 2021

(87) PCT Pub. No.: WO2020/200480
PCT Pub. Date: Oct. 8, 2020

(65) Prior Publication Data
US 2022/0209780 A1 Jun. 30, 2022

(51) Int. Cl.
*H03M 1/06* (2006.01)
*H03M 1/08* (2006.01)
(52) U.S. Cl.
CPC .......... *H03M 1/0675* (2013.01); *H03M 1/08* (2013.01)
(58) Field of Classification Search
CPC ...... H03M 1/144; H03M 1/462; H03M 1/002; H03M 1/1215; H03M 1/34; H03M 1/361;
(Continued)

(56) References Cited

U.S. PATENT DOCUMENTS 5,583,503 A 12/1996 Kusakabe
6,084,538 A * 7/2000 Kostelnik ........... H03M 1/1023
341/120

(Continued)

OTHER PUBLICATIONS

Song, J. et al., "A 10b 2b/cycle 300MS/s SAR ADC with a Single Differential DAC in 40nm CMOS", IEEE Custom Integrated Circuits Conference, Apr. 30-May 3, 2017, pp. 1-4.
(Continued)

*Primary Examiner* — Linh V Nguyen
(74) *Attorney, Agent, or Firm* — Coats & Bennett, PLLC

(57) ABSTRACT

A Successive Approximation Register, SAR, Analog to Digital Converter, ADC, (50) achieves high speed and accuracy by (1) alternating at least some decisions between sets of comparators having different accuracy and noise characteristics, and (2) unevenly allocating redundancy (in the form of LSBs of range) for successive decisions according to the accuracy/noise of the comparator used for the preceding decision. The redundancy allocation is compensated by the addition of decision cycles. Alternating between different comparators removes the comparator reset time (treset) from the critical path, at least for those decision cycles. The uneven allocation of redundancy—specifically, allocating more redundancy to decision cycles immediately following the use of a lower accuracy/higher noise comparators—compensates for the lower accuracy and prevents the need for larger redundancy (relative to the full-scale range of a decision cycle) later in the ADC process.

20 Claims, 11 Drawing Sheets

(58) Field of Classification Search
CPC ...... H03M 1/46; H03M 1/007; H03M 1/0697;
H03M 1/1023; H03M 1/121; H03M
1/1245; H03M 1/165; H03M 1/38; H03M
1/403; H03M 1/40; H03M 1/442
USPC .................................. 341/118–120, 155, 172
See application file for complete search history.

(56) References Cited

U.S. PATENT DOCUMENTS

| | | | | |
|---|---|---|---|---|
| 6,653,893 | B2* | 11/2003 | Casper | H03F 3/45672 |
| | | | | 330/252 |
| 8,319,675 | B2 | 11/2012 | Ogawa et al. | |
| 8,508,399 | B2 | 8/2013 | Lee et al. | |
| 8,749,412 | B1* | 6/2014 | Tsai | H03M 1/0697 |
| | | | | 341/120 |
| 8,766,844 | B2 | 7/2014 | Kull | |
| 8,912,942 | B2* | 12/2014 | Lin | H03M 1/46 |
| | | | | 341/172 |
| 9,847,790 | B2* | 12/2017 | Liu | H03M 1/54 |
| 10,020,816 | B1* | 7/2018 | Cleris | H03K 5/24 |
| 10,454,488 | B1* | 10/2019 | Monangi | H03M 1/462 |
| 11,159,171 | B1* | 10/2021 | Huang | H03M 1/54 |
| 11,387,838 | B1* | 7/2022 | Dyer | H03M 1/125 |
| 2009/0309778 | A1* | 12/2009 | Yoshinaga | H03M 1/0697 |
| | | | | 341/122 |
| 2013/0285843 | A1* | 10/2013 | Lin | H03M 1/144 |
| | | | | 341/110 |
| 2014/0070968 | A1* | 3/2014 | Janakiraman | H03M 1/0697 |
| | | | | 341/172 |

OTHER PUBLICATIONS

Liu, S. et al., "A 125 MS/s 10.4 ENOB 10.1 fJ/conv-step Multi-Comparator SAR ADC with Comparator Noise Scaling in 65 nm CMOS", IEEE 44th European Solid State Circuits Conference, Sep. 3-6, 2018, pp. 22-25.

Jiang, T. et al., "Single-Channel, 1.25-GS/s, 6-bit, Loop-Unrolled Asynchronous SAR-ADC in 40nm-CMOS", IEEE Custom Integrated Circuits Conference, Sep. 19-22, 2010, pp. 1-4.

Chang, K. et al., "A 12 bit 150 MS/s 1.5 mW SAR ADC with Adaptive Radix DAC in 40 nm CMOS", IEEE Asian Solid-State Circuits Conference, Nov. 7-9, 2016, pp. 157-160.

* cited by examiner (Fig. 1 from US 8,766,844)

SAR ADC WITH ALTERNATING LOW AND HIGH PRECISION COMPARATORS AND UNEVEN ALLOCATION OF REDUNDANCY

TECHNICAL FIELD

The present invention relates generally to Analog-to-Digital Conversion electronics, and in particular to a Successive Approximation Register type ADC that alternates between low and high precision comparators for successive decision cycles.

BACKGROUND

The conversion of information between analog and digital domains is a routine part of many electronic devices. For example, wireless communication networks propagate analog Radio Frequency (RF) carrier signals across an air interface between access nodes and mobile terminals; the carrier signals are modulated with information representing voice and data. At both the access nodes and mobile terminals, the received analog RF signals must be converted to digital data for processing by digital processing circuits, such as Digital Signal Processors (DSPs). Of course, signals transmitted in the other direction must be converted from the digital to the analog domain. Ideally, analog/digital conversion should be performed at high speed, with high accuracy, using small circuits that consume little silicon footprint and dissipate little power.

One known type of Analog-to-Digital Converter (ADC) that features low power consumption and a small form factor, at moderate speeds, is a Successive Approximation Register (SAR) type. A SAR ADC iteratively shrinks a search space, referred to herein as a range, with a scale that may either be fixed or varied. A SAR ADC in its most simple form determines one bit per decision cycle, and shrinks the range by a factor of two per cycle. In this case, the SAR ADC runs a binary search algorithm for each successive bit in a digital representation, from the Most Significant Bit (MSB) to the least (LSB). The speed of this type of SAR ADCs is limited, due to the need for N clock cycles to convert an analog voltage to an N-bit digital value.

A more elaborate SAR ADC may determine more than one bit per cycle, and may scale the range such that it covers a larger region than strictly needed in the ideal case, e.g., to allow for incorrect decisions due to noise, etc. This is referred to as redundancy.

FIG. 1 depicts the basic, 1-bit per cycle architecture of a SAR ADC 10, including a sample/hold circuit 12, comparator 14, SAR logic 16, N-bit register 18, and N-bit Digital-to-Analog Converter (DAC) 20. The analog input voltage $V_{IN}$ to be converted is captured in the sample/hold circuit 12 (which in some designs may be incorporated into a capacitor-DAC 20). The N-bit register 18 is initially set to mid-scale, with the MSB "1" and all other bits "0". This sets the DAC 20 voltage $V_{DAC}$ at half the reference voltage $V_{REF}$. The comparator 14 then determines whether the captured input voltage $V_{IN}$ is above or below the mid-point voltage $V_{REF}/2$. If above, a "1" is maintained in the MSB and the upper half of the range is the subrange selected for comparison in the next decision cycle. Alternatively, if $V_{IN}<V_{REF}/2$, the MSB is cleared to a "0" and the lower half of the range is the subrange selected for comparison in the next decision cycle. This process repeats successively for each of the next bits, down to the LSB.

FIG. 2 depicts the process for a simple, 4-bit SAR ADC 10. The bold line represents the DAC 20 output voltage $V_{DAC}$, the (constant) thin line is the input voltage $V_{IN}$, and the SAR ADC 10 output is the digital code below the abscissa. Initially, the 4-bit register 18 is set to $1000_2$, and $V_{IN}$ is compared to $V_{REF}/2$. Since $V_{IN}<V_{REF}/2$, the MSB is cleared to "0". The 4-bit register 18 is then set to $0100_2$, and $V_{IN}$ is compared to $V_{REF}/4$ (the center of the subrange $0-V_{REF}/2$ selected in the preceding decision cycle—had the previous bit been a 1, the comparison would be to the subrange $V_{REF}/2-V_{REF}$, and centered on $3V_{REF}/4$). Because $V_{IN}>V_{REF}/4$, the "1" is retained for this bit position, and the next lower bit is set to one, yielding $0110_2$, which compares the input voltage to $V_{DAC}=3V_{REF}/8$. $V_{IN}$ is below this value, so this bit value is cleared, and the last bit is tested with the 4-bit register 18 being set to $0101_2$, for $V_{DAC}=7V_{REF}/16$. Because $V_{IN}$ exceeds this value, the "1" is retained for the LSB, and the SAR ADC 10 output is $0101_2$ for this value of $V_{IN}$.

Rather than fractional values of $V_{IN}$, which rapidly become unwieldy for wider N-bit registers 18, the ordinate of the graph in FIG. 2 may alternatively be denominated as the decimal value of the binary weight of the respective bit position, as indicated by the values in parentheses. This notation facilitates discussion of accuracy, which can be considered as a number of bits (LSB increments), or fractions thereof. The SAR DAC 10 output is also represented as a decimal number corresponding to the binary output of the N-bit register 18.

FIG. 3 depicts a SAR ADC that resolves two bits per decision cycle. Three comparators 14a, 14b, 14c and three corresponding reference voltages $V_{REFa}$, $V_{REFb}$, $V_{REFc}$ divide the range of $V_{DAC}$ into four sub-ranges. The outputs of the comparators 14a, 14b, 14c, which will cascade in thermometer coding for increasing values of $V_{IN}$, can be decoded into a 2-bit binary value by decoder 22, which is stored in the N-bit register 18. Additionally, the two bits, which identify the subrange selected by the previous decision cycle, are used to generate the reference voltages $V_{REFa}$, $V_{REFb}$, $V_{REFc}$. In embodiments which omit the decoder 22, the comparator 14 outputs are thermometer coded, and may be used directly to generate the reference voltages.

The ADCs depicted in FIGS. 1 and 3 employ "flash" converters, also known as direct-conversion converters, wherein comparators compare the input voltage to successive reference voltages to determine within which of two or more subranges it falls. Flash converters may be constructed to simultaneously convert an analog input to any integer number m of bits per cycle, using $2^m-1$ comparators and splitting the $V_{DAC}$ range into $2^m$ subranges. The output of a flash converter is thermometer coded, which may then be converted to binary coding. Fractional-bit converters are also known in the art, e.g., converting 1.5 bits per decision cycle.

One characteristic by which various SAR DAC designs may be compared is precision. As used herein, "precision" refers to the ability of the comparator to resolve a small differential input voltage in the presence of noise. In order to have a correct decision, the noise level should be much smaller than the input differential voltage. A high precision comparator has lower noise, thus is able to resolve smaller differential input voltage when compared to a lower precision comparator that is noisier.

Another SAR ADC design parameter is redundancy margin. As used herein, "redundancy margin" refers the over-provisioning of the range at one or more decision levels, such that for a given decision cycle, errors up to a certain level introduced at earlier cycles can be captured. Redundancy margin can be selectively allocated to different decision cycles.

A SAR ADC can be synchronous or asynchronous. In a synchronous SAR ADC, each decision cycle is triggered by a transition of an externally provided clock. In an asynchronous SAR ADC, usually only the first decision cycle is triggered by a transition of an externally provided clock. Subsequent decision cycles are triggered internally—when a decision has been completed, it can be detected and be used to trigger a following decision cycle.

Faster operation is a perennial goal of virtually all electronics. For example, as RF signal frequencies utilized in wireless communication networks increase (e.g., 5G systems, also known as New Radio, or NR, may utilize carrier frequencies from 1 to 100 GHz), ever higher-speed ADCs are required. The critical path in a synchronous or asynchronous SAR ADC is formed by the DAC settling time ($t_{DAC}$), the comparator reset time ($t_{Comp}$), the time required for the SAR logic to register the comparator decisions and output DAC control signals ($t_{SAR}$) and the comparator reset time ($t_{reset}$). Overall speed of a SAR ADC also depends on its resolution, as each cycle only decides a limited number of bits. Hence, intuitively, a 16-bit SAR ADC should take twice as long as an 8-bit SAR ADC. However, in an 8-bit SAR ADC, the DAC must settle to within 8-bit accuracy before obtaining a stable comparator output (and decision), while in a 16-bit ADC, the DAC must settle to within 16-bit accuracy, which takes significantly longer. Hence, each cycle in a 16-bit SAR ADC is longer than the corresponding cycle in an 8-bit architecture, increasing the overall relative delay significantly past 2×. Several approaches to increasing SAR ADC speed, for a given resolution, have been explored in the prior art.

Comparator Alternation

One known approach is to remove the comparator reset time ($t_{reset}$) from the critical path by alternating between matched comparators. A 1-bit/cycle SAR ADC uses one of two alternating comparators every cycle, so that the comparator used in the previous bit-decision has one full decision cycle to reset itself, while the other comparator handles the present decision. This architecture is illustrated in FIG. 4.

A drawback of this approach is that alternating comparators offset must be matched to within ½ LSB to guarantee convergence. To achieve such precise matching, the comparators must either be overdesigned or calibrated—both of which results in an area and/or power dissipation penalty. Additionally, matching must be maintained over variations in process, voltage, temperature (PVT). Furthermore, in the event of calibration being used, time must be allocated for calibration on a regular basis. See U.S. Pat. No. 8,766,844.

Different Precision Comparators

Another prior art approach also uses two comparators for a 1-bit/cycle conversion. Here, the first comparator is noisier than the second comparator and the initial bit cycles, where redundancy margin is large, uses the noisier comparator. The remaining bit cycles use a less noisy (higher precision) comparator. One detriment of this approach is that significant redundancy margin is consumed by the noisy comparator during the initial bit cycles. Furthermore, the comparator reset time ($t_{reset}$) remains a bottleneck for high speed SAR operation, as comparator alternation is not used. See U.S. Pat. No. 8,319,675.

Loop-Unrolled

Yet another approach is a loop-unrolled technique, which removes the comparator reset time ($t_{reset}$) by using N comparators with same level of precision for an N-bit SAR ADC, that is one unique comparator per decision cycle. This increases the complexity and overhead for calibrating the comparators, as well as the capacitive load of the DAC output node. See Tao Jiang, et al., "Single-channel, 1.25-GS/s, 6-bit, loop-unrolled asynchronous SAR-ADC in 40 nm-CMOS," IEEE Custom Integrated Circuits Conference, San Jose, Calif., 2010, pp. 1-4.

Multi-Bit Per Cycle Conversion

Still another approach uses at least some 2-bits/cycle conversions, which effectively compare an input over four regions. The technique also uses 1-bit/cycle conversions by employing only one of the sets of comparators. The architecture exploits both differential mode and common mode DAC signals. This technique does not eliminate the reset time ($t_{reset}$) bottleneck. See J. Song, et al., "A 10-b 2b/cycle 300 MS/s SAR ADC with a single differential DAC in 40 nm CMOS," 2017 IEEE Custom Integrated Circuits Conference, Austin, Tex., 2017, pp. 1-4.

In addition to speed, accuracy of a SAR DAC is an obvious concern. One source of inaccuracy, as mentioned above with respect to the prior art, is comparator offset mismatch, which may require careful matching (e.g., to ½ LSB) to mitigate. Another source of inaccuracy is known as kickback noise. Kickback noise in comparators arises due to the feed-through of large voltage transitions inside the comparator through parasitic coupling capacitors to the comparator input port. This noise is added to the (desired) comparator input signal, which may sometimes lead to incorrect comparator decisions in subsequent decision cycles.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

According to embodiments of the present invention disclosed and claimed herein, the speed of a SAR ADC (for a given resolution) is increased by (1) alternating at least some decisions between comparators (or sets of comparators, for n-bit/cycle decisions) having different accuracy and noise characteristics, and (2) unevenly allocating redundancy (in the form of LSBs of range) for successive decisions according to the accuracy/noise of the comparator (or set) used for the preceding decision, and compensating for the redundancy allocation with one or more additional decision cycles. Alternating between different comparators (or sets) removes the comparator reset time ($t_{reset}$) the critical path, at least for those decision cycles. The uneven allocation of redundancy—specifically, allocating more redundancy to decision cycles immediately following the use of a lower accuracy/higher noise comparators (or sets)—compensates for the lower accuracy and prevents the need for larger redundancy (relative to the full-scale range of a decision cycle) later in the ADC process. Whatever the mix of comparators used in the early (MSB) decision cycles, lower noise (higher accuracy) comparators are deployed for a plurality of the last (LSB) decision cycles.

One embodiment relates to a method of performing a SAR ADC process, using a SAR ADC comprising a first comparator set, each comparator in the first comparator set having substantially a same first precision and first noise level. The SAR ADC further comprises a second comparator set, each comparator in the second comparator set having substantially a same second precision which is greater than the first precision, and second noise level which is lower than the first noise level. For each analog value conversion, a first decision cycle is performed using one of the first and second comparator sets against a first range, resulting in an indication of a first subrange. A redundancy amount for a successive decision cycle is selected in response to whether the first decision cycle is performed using the first or second comparator set. A second decision cycle is performed immediately after the first decision cycle, using the other of the first and second comparator sets against a second range greater than the first subrange by the selected redundancy amount.

Another embodiment relates to a SAR ADC. The SAR ADC includes a first comparator set, each comparator in the first comparator set having substantially a same first precision and first noise level. The SAR ADC also includes a second comparator set, each comparator in the second comparator set having substantially a same second precision which is greater than the first precision, and second noise level which is lower than the first noise level. The SAR ADC further includes SAR logic adapted to perform a first decision cycle using one of the first and second comparator sets against a first range, resulting in an indication of a first subrange. The SAR logic is further adapted to select a redundancy amount for a successive decision cycle in response to whether the first decision cycle is performed using the first or second comparator set. The SAR logic is also adapted to perform a second decision cycle immediately after the first decision cycle, using the other of the first and second comparator sets against a second range greater than the first subrange by the selected redundancy amount.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Figure 1:
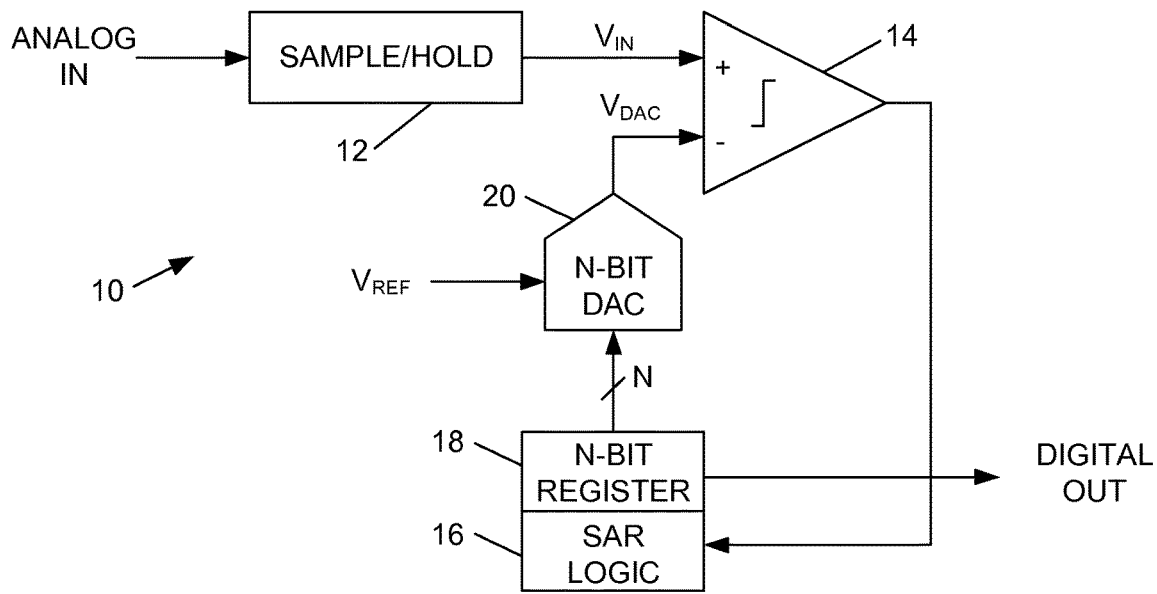
FIG. 1 is a block diagram of a prior art SAR ADC.
Figure 2:
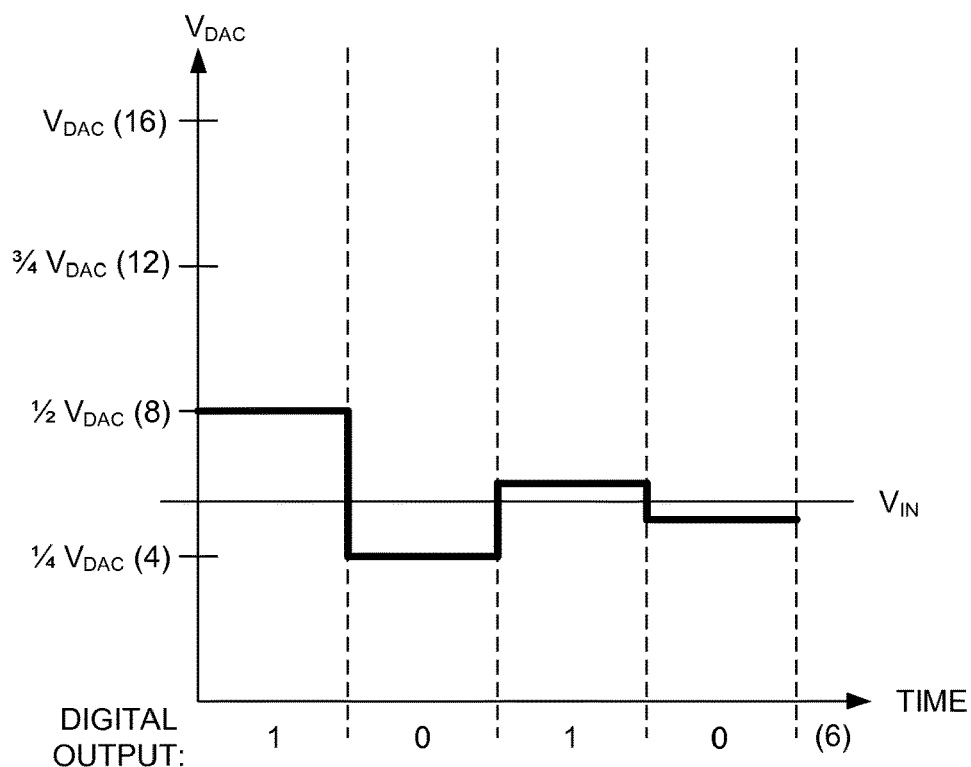
FIG. 2 is a graph depicting operation of a 4-bit SAR ADC.
Figure 3:
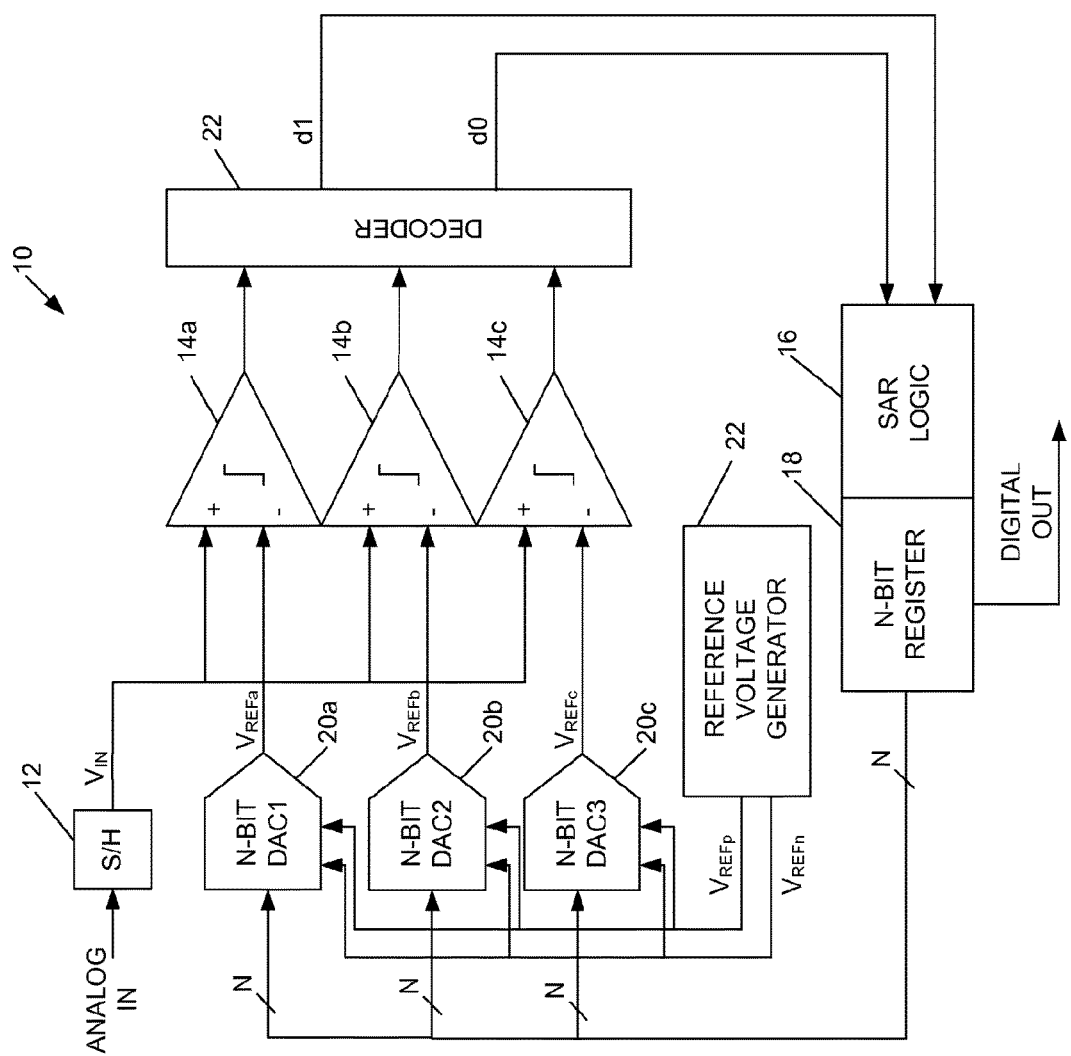
FIG. 3 is a block diagram of a prior art, multi-bit SAR ADC.
Figure 4:
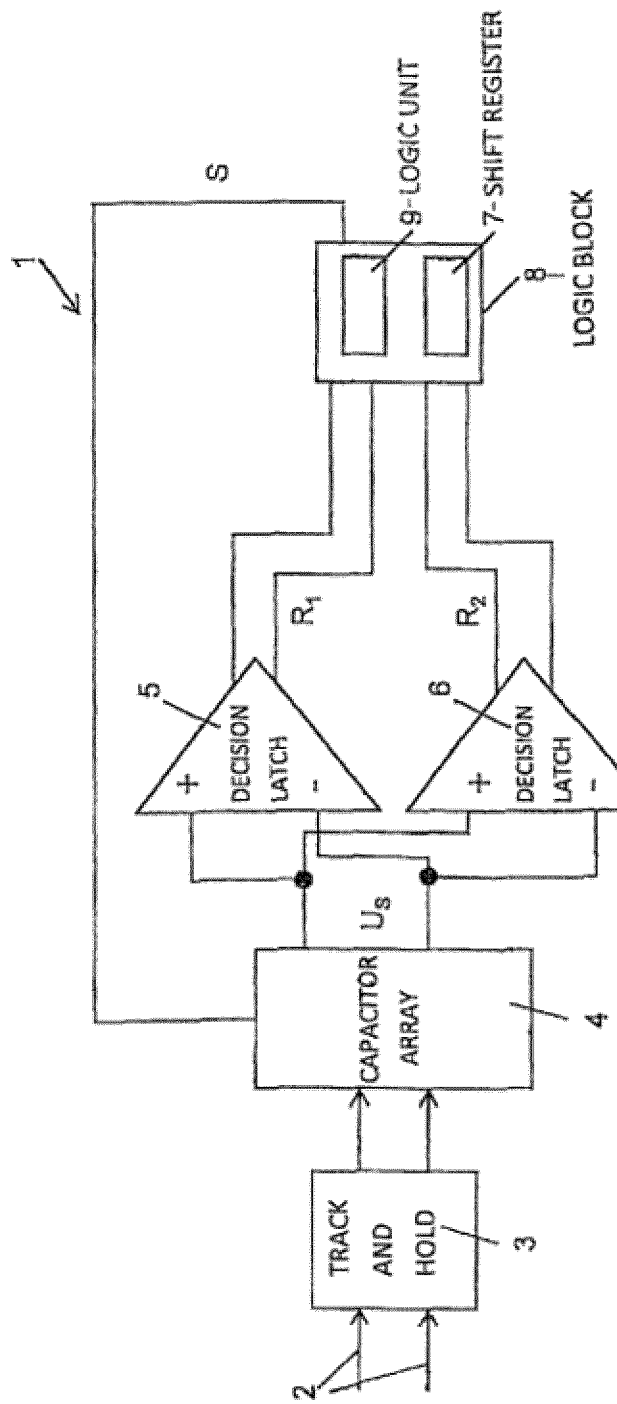
FIG. 4 is a block diagram of a prior art SAR ADC using alternating comparators.
Figure 5:
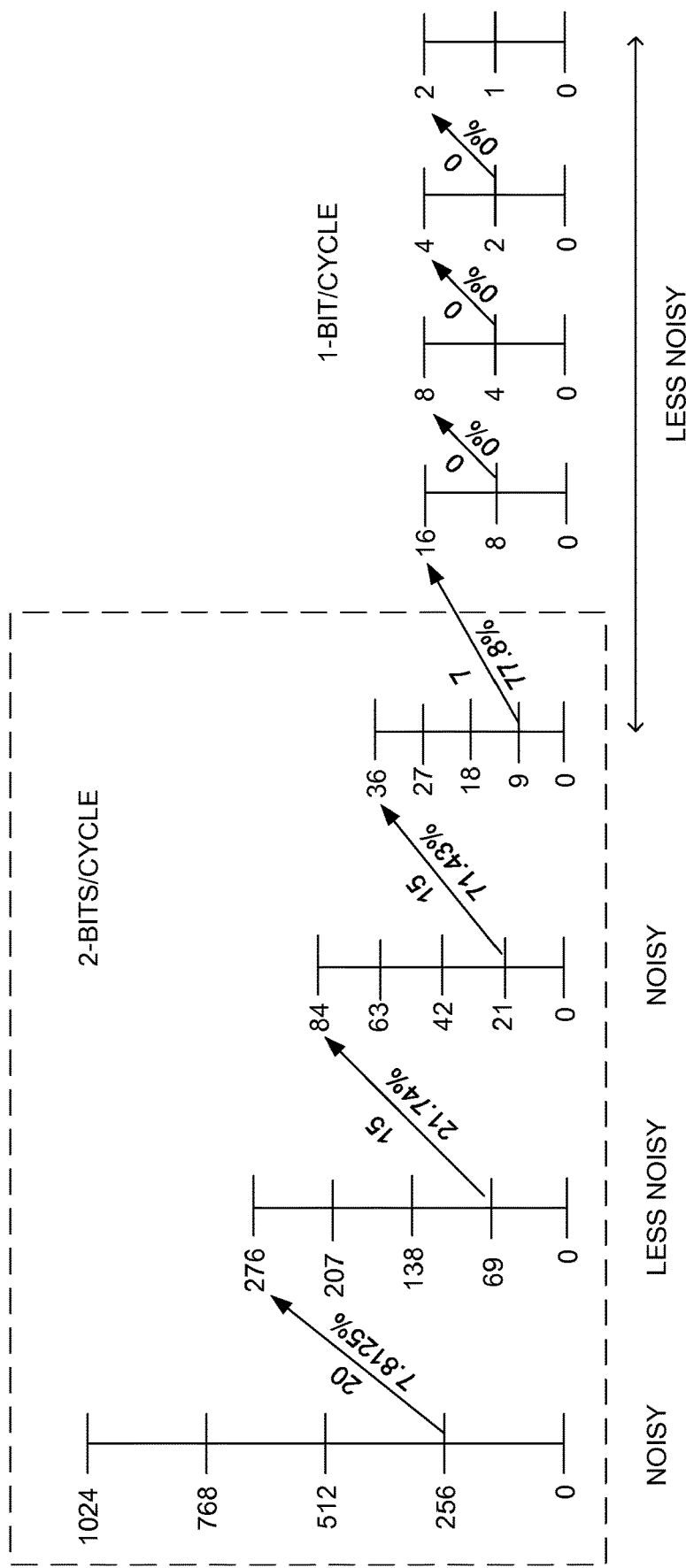
FIG. 5 is a range diagram of a SAR ADC mixing multi-bit and 1-bit decision cycles, and alternating comparator sets beginning with a noisy comparator set.

FIG. 5 depicts a representation of the successive subranges and decision cycles for a 10-bit SAR ADC according to one embodiment. For simplicity, $V_{IN}$ is assumed to always be in the lowest subrange at each comparison (i.e., it is ~0). The ranges and subranges are not to scale.

Numerous features distinguish this embodiment from SAR ADCs known in the art. The first four decision cycles are performed using 2-bits/cycle—accordingly, they employ sets of three comparators, dividing each successive range into four subranges. The last four decision cycles are performed using 1-bit/cycle—accordingly, these cycles employ a single comparator, dividing each successive range into two subranges. The total digital value generated is 12 bits (four 2-bit cycles and four 1-bit cycles). As explained below, two of these cycles compensate for redundancy introduced into the conversion, and the 12-bit output is effectively converted to a 10-bit value.

The SAR ADC of this embodiment includes two sets of three comparators each. Within each set, the comparators are at least nominally matched in electrical and performance characteristics. Between the sets, however, they differ significantly. A first set of three comparators has a relatively low precision, and a relatively high noise level. A second set of comparators has a relatively high precision, and relatively low noise level. Those of skill in the art will recognize that the characterizations of precision and noise are only valid in comparing the two sets of comparators to each other. In particular, the offset mismatch (e.g. measured as standard deviation over a population of comparators) of a relatively high precision comparator is at least 2 times less than that of a relatively low precision comparator. Similarly, the comparator noise of a relatively low precision comparator is at least 3 dB higher than a relatively high precision comparator. For convenience, the first set is referred to herein as "noisy" comparators (with relatively low precision), and the second set as "less noisy" (with relatively higher precision). The comparators can be dynamic, or static, or partly dynamic and partly static in nature.

In one embodiment, the alternating comparator sets for multi-bit per cycle operation is designed such that a pair of alternating noisy and less noisy comparators share a common pre-amplifier stage. Sharing a pre-amplifier reduces the top-plate DAC parasitic capacitance and results in less signal attenuation.

One aspect of the SAR ADC of FIG. 5 is that, over the first four decision cycles, alternating noisy and less noisy sets of comparators are employed, while the last four decision cycles all employ the less noisy comparators. Using alternating sets of comparators for some decision cycles helps to prevent the comparator reset time ($t_{reset}$) from becoming the bottleneck for high speed SAR ADC operation. Note that in this embodiment, the use of alternating comparator sets coincides with 2-bits/cycle detection (i.e., over first four decision cycles). Similarly, at cycle 5 the SAR ADC both switches to less noisy comparators exclusively, and also 1-bit/cycle operation. In general, as other embodiments disclosed herein will demonstrate, the use of alternating precision of comparators, and the number of bits decided per cycle, are independent parameters.

The first decision, made by a first set of comparators having relatively high noise and low precision, is performed against a full range of 1024 bits of precision, for a 10-bit SAR ADC. The lowest subrange, 0-256, is selected. To compensate for the imprecision of the first set of comparators, the range of the second decision is not the subrange selected in the preceding decision, but a subrange wider by 20 LSB, that is, 0-276 LSBs. That is, the first decision is assumed to have a maximum potential error of +/−7.8125%. The 20 LSBs of redundancy comprise 3 LSBs allocated for comparator noise, 9 LSBs for DAC settling error, and 8 LSBs for comparator offset mismatch. These values, and the comparator set type, are collected in Table 1 for each decision cycle:

TABLE 1

Redundancy Allocation per Decision Cycle for Embodiment of FIG. 5

| Bits per Decision Cycle | 2-bits/cycle | | | | 1-bit/cycle | | |
|---|---|---|---|---|---|---|---|
| Noisy (N) or Less Noisy (LN) | N | LN | N | LN | LN | | |
| Comparator Noise [LSBs] | 3 | 0.5 | 3 | 0.5 | 0 | 0 | 0 |
| DAC Settling [LSBs] | 9 | 10.5 | 4 | 2.5 | 0 | 0 | 0 |
| Offset Mismatch [LSBs] | 8 | 4 | 8 | 4 | — | — | — |
| Total Redundancy [LSBs] | 20 | 15 | 15 | 7 | 0 | 0 | 0 |

As expected, the redundancy allocated for comparator noise is very low for the less noisy set, and higher for the noisy set. Correspondingly, the comparator offset mismatches are higher for the noisy set. There is no offset mismatch for the last three cycles, as the same (less noisy) comparator is used in each cycle. In each noisy/less noisy pair, greater total redundancy is allocated to the cycle using the noisy comparator set.

FIG. 5 depicts the total redundancy allocated to each decision cycle, and the error it represents. As the ranges decrease, the redundancy becomes a larger percentage of the range, with the 7 LSBs of redundancy added to cycle 4 representing nearly 78% potential error. No redundancy is allocated in the last four cycles, due to the higher precision of the less noisy comparator used, and the very small ranges.

A tradeoff has to be made on how many bit cycles would benefit from a multi-bit conversion and when a transition to 1-bit per cycle could be beneficial. Since the full-scale range reduces after every consecutive decision cycle, the requirements for the comparator in terms of the noise and offset mismatch (in the case of multi-bit) become more stringent. Relaxing these error sources (comparator noise, DAC settling, dynamic offset, offset mismatch) in SAR ADC conversion towards the last few decision cycles can be challenging, as this results in additional, redundancy-induced decision cycles. Adding additional decision cycles when designing a high-speed SAR ADC reaches a point of diminishing returns. For example, in the embodiment of FIG. 5, with the values in Table 1, the penalty for providing redundancy for multi-bit cycles, and redundancy for the transition from multi-bit to single bit cycles, is two additional 1-bit decision cycles in order to obtain the final 10-bit resolution. In other words, in this embodiment, the 12-bit digital output is converted to an effective 10-bit digital output.

Figure 6:
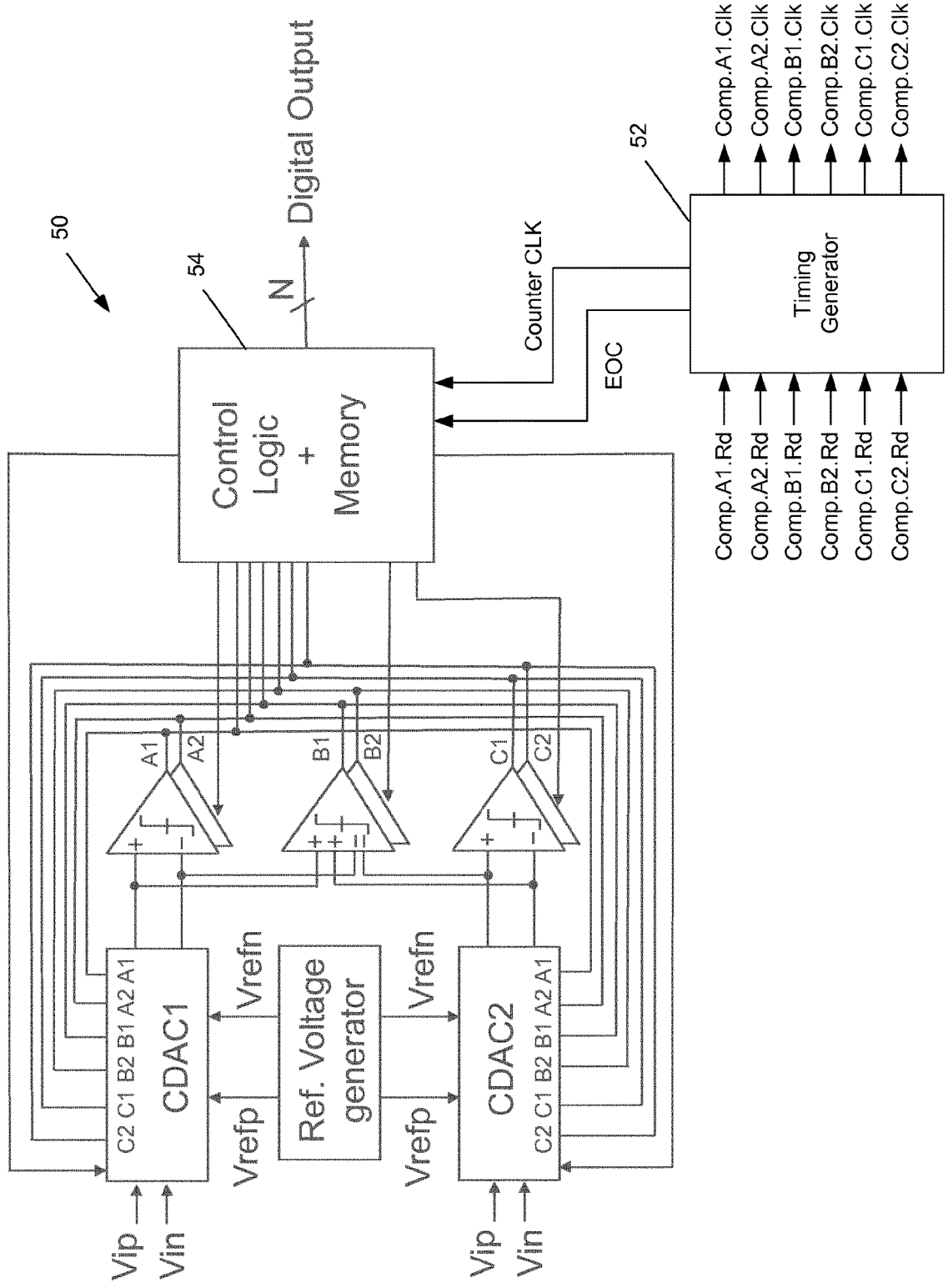
FIG. 6 is a schematic diagram of a SAR ADC having alternating comparator sets, and capable of performing 1-bit or multi-bit decision cycles.

FIG. 6 depicts one embodiment of a SAR ADC 50 having two sets of comparators, and capable of performing both 2-bit/cycle and 1-bit/cycle operations. Two differential capacitor-DACs (CDAC1, CDAC2) are used. Other implementations are contemplated, such as using a single differential CDAC to generate the three comparator thresholds for a 2-bit conversion. Moreover, different methods of DAC switching and DAC types (split, bridge, C-2C) can be used to implement the concept. Depending on the amount of redundancy used each decision cycle (for non-distributed redundancy) and the extent to which the alternating comparators are used (i.e., how many decision cycles), the DAC weights can be decided appropriately.

For a typical 2-bit conversion, all three comparators of a set are used. The comparators are divided into 2 sets: A1, B1, C1 and A2, B2, C2. The first set comprises noisy (lower precision) comparators and the second set comprises less noisy (higher precision) comparators. In this embodiment, the transition from 2-bit to 1-bit conversion occurs from a less noisy set to a single less noisy comparator in the same set. This eliminates the comparator mismatch requirements between the two comparator groups for the multi-to-single-bit transition. Each comparator has a clock input (Comp.X-.Clk) and a ready output (Comp.X.Rd), which are outputs of and inputs to, respectively, a timing generator circuit 52. The timing generator circuit 52 also generates Counter Clk and End of Cycle (EOC) signals to the control logic 54. The operation of these signals is depicted in the timing diagram of FIG. 7, discussed below.

As in the embodiment of FIG. 5, once the transition to 1-bit per cycle occurs, alternating comparators are not used. This implies that the comparator reset time ($t_{reset}$) becomes a bottleneck. Because there is a direct comparator-to-DAC control, DAC settling is not a bottleneck, as ample time is available for the DAC voltage settling. If alternating comparators were to be used towards the last few decision cycles, the comparator offset mismatch requirements should be <½ LSB. This requirement translates into a stringent offset calibration requirement for the comparators, which increases the calibration cost. Having redundancy towards the last few decision cycles can result in additional decision cycles, which can reduce the core ADC speed (as reset time is the bottleneck).

Figure 7:
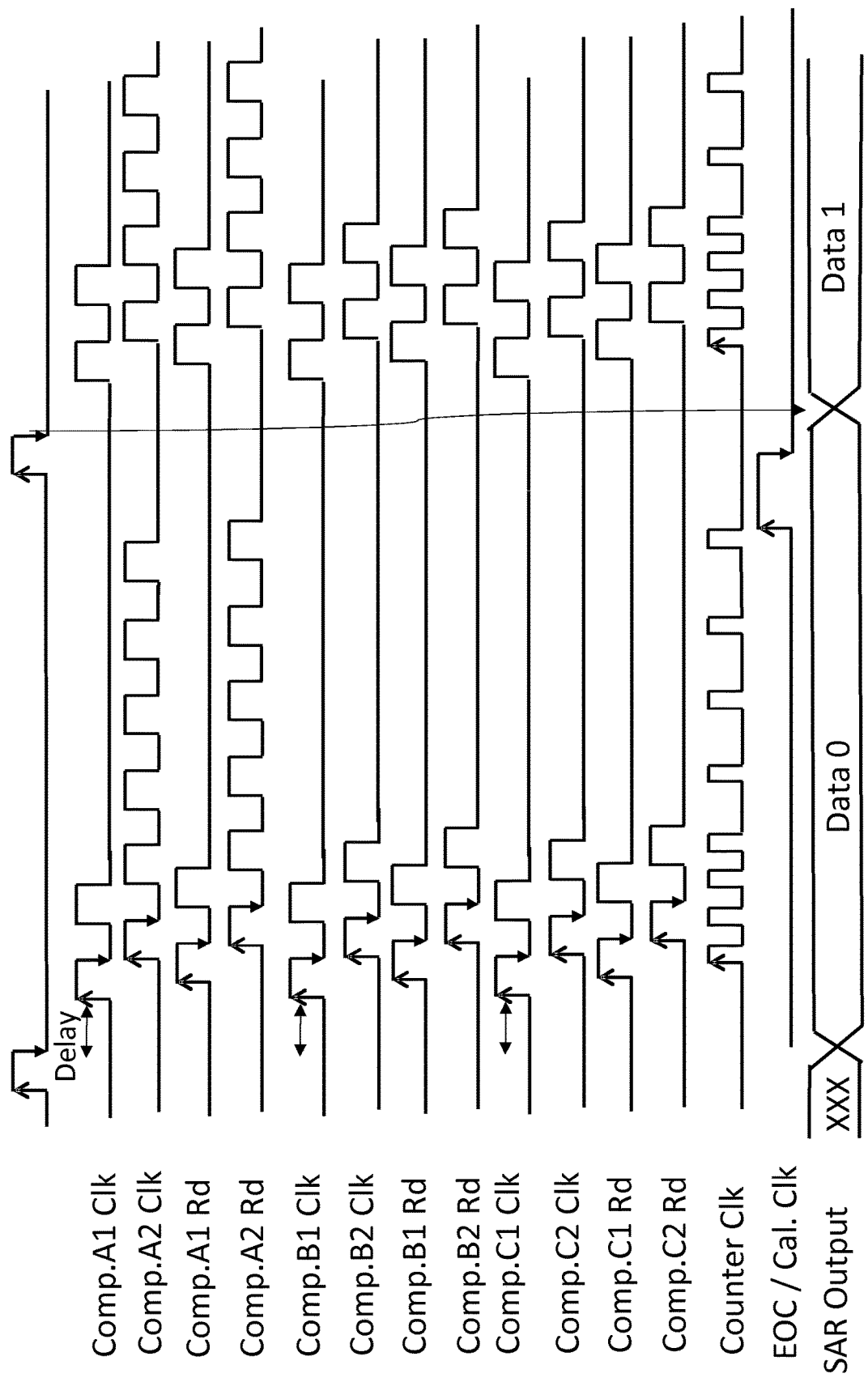
FIG. 7 is a timing diagram of an asynchronous SAR ADC.

The outputs of the comparator sets have direct feedback to the DAC weights, which reduces the control logic delay. The outputs of the comparators also go through some digital logic cells before switching the DAC capacitors appropriately. The outputs of the comparators are stored in a memory and an asynchronous logic state machine within the SAR logic 54 controls the timings of various SAR sub-block. FIG. 7 shows one implementation of the asynchronous timing diagram for the implementation shown in FIG. 6. Rising edges of the comparator clock (Comp.X.Clk) are when the respective comparator is triggered, and rising edges of comparator ready (Cmp.X.Rd) are when the respective comparator is ready. Data 0 refers to one sample conversion with multiple decision cycles, and it is only in the first four decision cycles that all of A1, A2, B1, B2, C1, and C2 are active. In subsequent one-bit cycles, only A2 is active.

Other embodiments may utilize a binary or non-binary scaled DAC with redundancy, shared or not-shared pre-amplifier stages of the comparators, and may begin conversion with a noisy or less noisy comparator for the first alternating comparator group. Furthermore, in another embodiment, the two sets of comparators may not include the same number of comparators. For example, a first set of comparators may be an m-bit set, with $2^m-1$ comparators, while a second set of comparators may be a k-bit set, with $2^k-1$ comparators, where k≠m. In this embodiment, decision cycle may alternate between, e.g., m=2 and k=2.5, or m=1.5 and k=2 for similar reasons as alternating between high and low precision. In this embodiment, the more noisy set could be the one having fewer bits, since it has lower precision anyway.

The architecture of FIG. 6 is highly flexible, as the same hardware can be utilized for multi-bit or 1-bit decision cycles. Furthermore, successive cycles can utilize alternating sets of comparators, or can use the same comparator set (e.g., for the last cycles in the ADC process). In general, SAR logic 54 controls the overall SAR ADC process, including each decision cycle. As known in the art, the SAR logic 54 may be hardwired, implementing a specific sequence of operations, or it may be programmable, allowing the same SAR ADC 50 to perform different combinations of operations, some examples of which are described herein. In either case, the SAR logic 54 may comprise one or more state machines, programmable logic together with appropriate firmware, a digital processor or controller together with appropriate software, or any combination thereof. The SAR logic 54 may be implemented as full custom circuitry (e.g., on an integrated circuit), as programmable logic such as an FPGA, as a fully integrated processor or DSP, or any combination thereof. Appropriate memory storage may be provided, e.g., to store control bits, firmware, or software, as required or desired.

Figure 8:
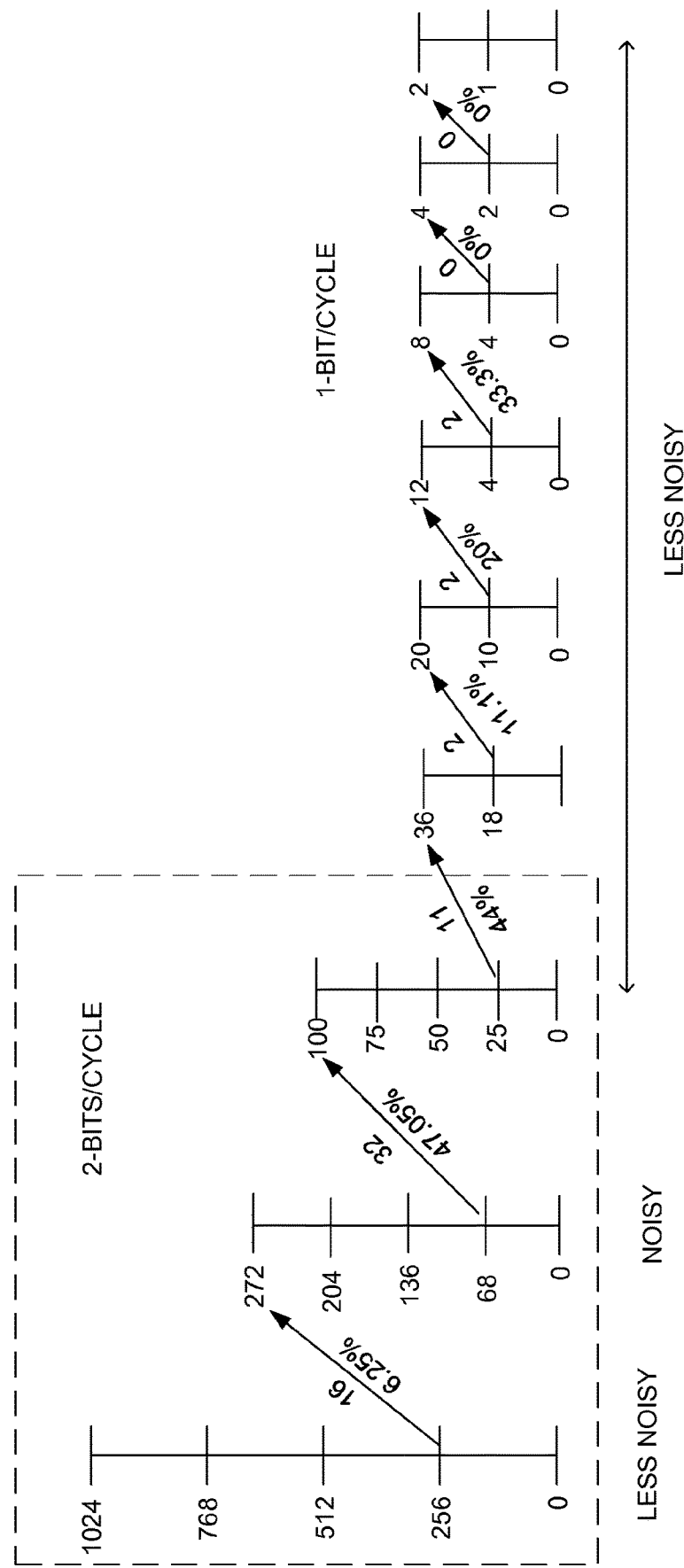
FIG. 8 is a range diagram of a SAR ADC mixing multi-bit and 1-bit decision cycles, and alternating comparator sets beginning with a less noisy comparator set.

FIG. 8 depicts a representation of the successive sub-ranges and decision cycles for a 10-bit SAR ADC according to another embodiment. Here, the first three decision cycles are performed using 2-bits/cycle. The first decision cycle utilizes a less noisy (higher precision) comparator set, alternating in the second, 2-bit decision cycle with a noisy comparator set. The redundancy allocation is depicted in Table 2 below. Note that a higher offset mismatch relaxation is utilized than in the embodiment of FIG. 5. It can be observed that the fourth decision cycle does not have sufficient redundancy margin to achieve another 2-bit conversion using a low precision comparator. Here, all the redundancy in fifth decision cycle is allocated to the DAC settling. If a low precision comparator were to be used, then an additional 3 LSBs of redundancy would be required. Nevertheless, a designer can utilize another 2-bit conversion cycle by paying the penalty of additional redundancy-induced-decision cycles, which can add to the SAR ADC conversion time, as comparator reset time ($t_{reset}$) is the bottleneck for the remaining 1-bit/cycle decisions.

TABLE 2

Redundancy Allocation per Decision Cycle for Embodiment of FIG. 8

| Bits per Decision Cycle | 2-bits/cycle | | | 1-bit/cycle | | | |
|---|---|---|---|---|---|---|---|
| Noisy (N) or Less Noisy (LN) | LN | N | | LN | | | |
| Comparator Noise [LSBs] | 0.5 | 3 | 0.5 | 0 | 0 | 0 | 0 |
| DAC Settling [LSBs] | 7.5 | 13 | 2.5 | 2 | 2 | 2 | 0 |
| Offset Mismatch [LSBs] | 8 | 16 | 8 | — | — | — | — |
| Total Redundancy [LSBs] | 16 | 32 | 11 | 2 | 2 | 2 | 0 |

The embodiment of FIG. 8 takes nine decision cycles, as compared to the eight decision cycles in the embodiment of FIG. 5. Having higher redundancy margin to incorporate larger error sources (such as comparator offset mismatch) can result in additional decision cycle(s). Preferably, the transition from multi-bit per decision cycle to single bit per decision cycle occurs from a less noisy comparator set to a less noisy comparator (in order to avoid comparator offset mismatch requirements). For the embodiment of FIG. 8, starting with a less noisy comparator requires alternating the comparators into the first five decision cycles. In general, correcting for large error sources, such as a large offset mismatch, will require large redundancy margin. This creates the need for additional (redundancy-induced) decision cycles. If alternating comparators are restricted to a few decision cycles—such as the three decision cycles in the embodiment of FIG. 8—then the additional redundancy-induced decision cycles have to be resolved by the non-alternating comparator, 1-bit/cycle topology. Having a greater number of non-alternating comparator based decision cycles puts the comparator reset time ($t_{reset}$) in the critical path, slowing down the ADC speed and defeating the goal of achieving a high-speed SAR ADC.

Figure 9:
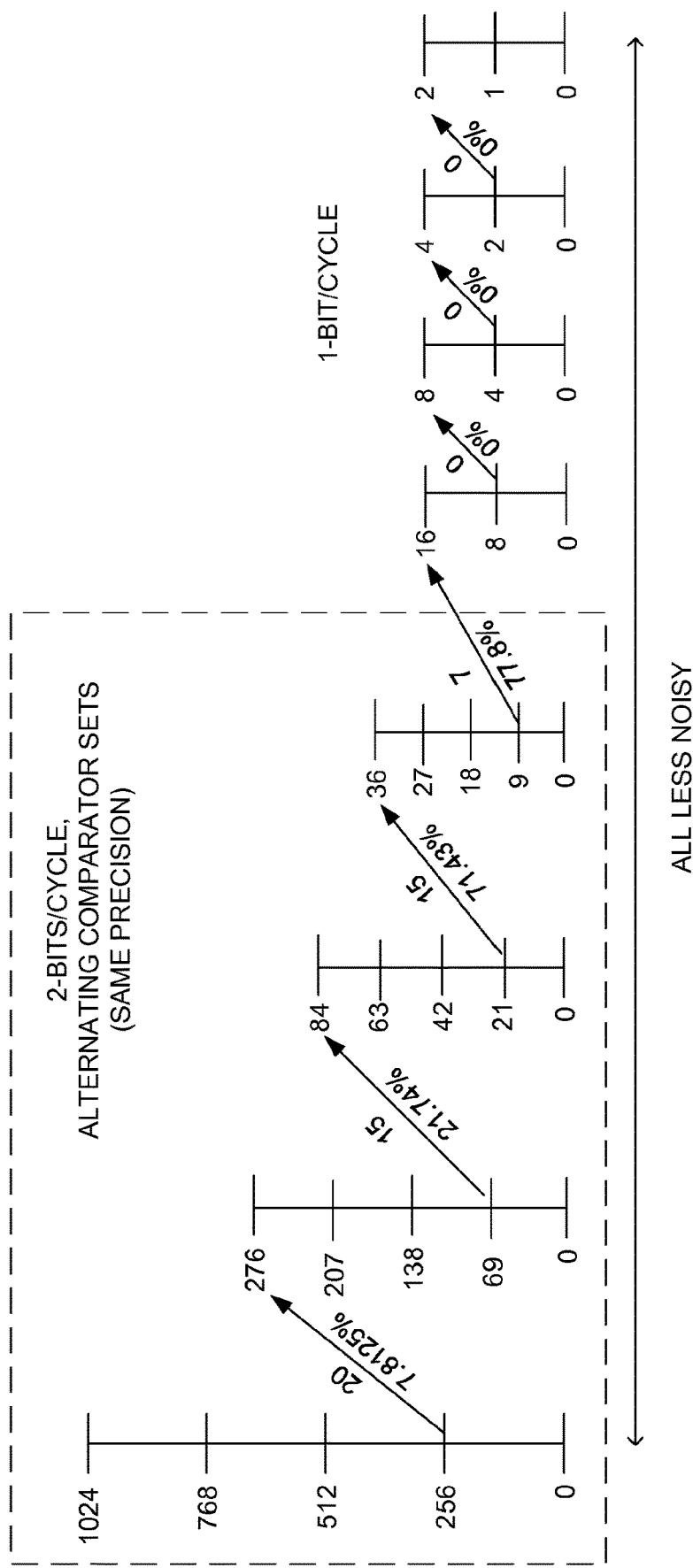
FIG. 9 is a range diagram of a SAR ADC mixing multi-bit and 1-bit decision cycles, and comprising all less noisy comparators.

FIG. 9 depicts a representation of the successive sub-ranges and decision cycles for a 10-bit SAR ADC according to another embodiment. Here, the redundancy margins per decision cycle are similar to the embodiment of FIG. 5. However, in this embodiment, although the first four decision cycles alternate comparator sets, thus removing comparator reset time ($t_{reset}$) from the critical path, both sets of comparators have the same (higher) precision. That is, only less noisy comparators, with a comparator offset mismatch requirement of four LSBs, are used throughout. Achieving the same stringent offset mismatch requirement for both alternating comparator sets requires a larger calibration overhead, compared to the alternating comparator sets having different precisions. Additionally, the advantages gained by using a noisy comparator set for some decision cycles (such as faster decision time and low calibration overhead) are lost in the embodiment of FIG. 9.

TABLE 3

Redundancy Allocation per Decision Cycle for Embodiment of FIG. 9

| Bits per Decision Cycle | 2-bits/cycle | | | | 1-bit/cycle | | |
|---|---|---|---|---|---|---|---|
| Noisy (N) or Less Noisy (LN) | Less Noisy (higher precision) | | | | | | |
| Comparator Noise [LSBs] | 0.5 | 0.5 | 0.5 | 0.5 | 0 | 0 | 0 |
| DAC Settling [LSBs] | 15.5 | 10.5 | 10.5 | 2.5 | 0 | 0 | 0 |
| Offset Mismatch [LSBs] | 4 | 4 | 4 | 4 | — | — | — |
| Total Redundancy [LSBs] | 20 | 15 | 15 | 7 | 0 | 0 | 0 |

The above embodiments deploy various combinations of multi-bit and single-bit conversion cycles, with alternating noisy and less noisy comparator sets. The advantages of alternating between noisy and less noisy comparators is independent of the advantages of mixing multi-bit and single-bit decision cycles, and the benefits of the former accrue in SAR ADC designs that use exclusively 1-bit/cycle decisions. In this case, towards the last few decision cycles, a less noisy comparator should be used. Hence, a designer may choose to not use alternating comparators. There is an optimum point along the decision progression from MSB to LSB, after which the alternating comparator architecture should be avoided to reduce the comparator offset mismatch calibration cost. This optimum point can be determined by using the following parameters (which depends on the specifications of the SAR ADC, for example, speed, full-scale, resolution):

The number of additional decision cycles a SAR ADC can tolerate without losing the advantage of using redundancy. That is, the speed gained by reducing the duration of each decision cycle, because of using redundancy, should not be squandered by excessive additional decision cycles;

The amount of comparator noise and comparator offset mismatch to be tolerated; and The amount of DAC settling relaxation required.

Figure 10:
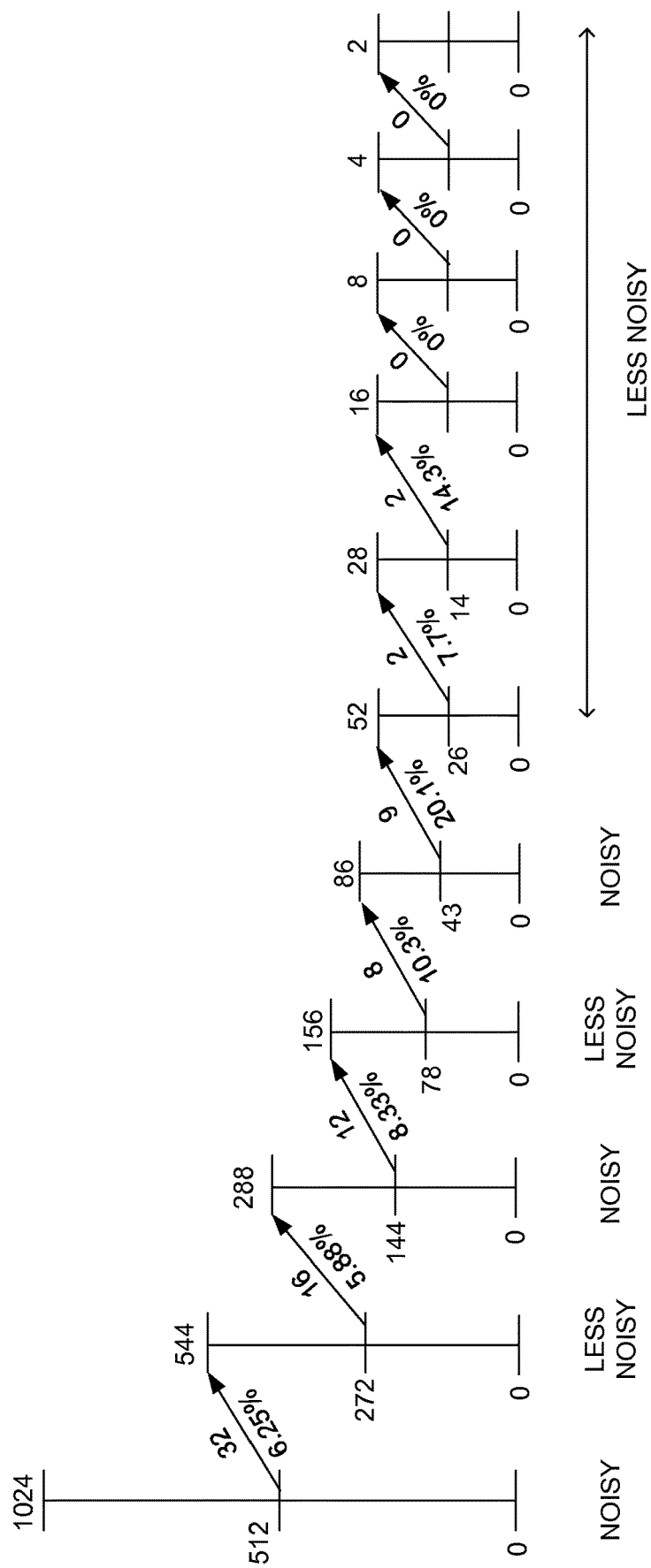
FIG. 10 is a range diagram of a SAR ADC performing only 1-bit decision cycles, and alternating comparator sets beginning with a noisy comparator set.

FIG. 10 depicts a SAR ADC converting a single bit per decision cycle throughout. Again, it is assumed for simplicity that the analog input value is 0. The first six decision cycles use alternating precision of comparators. This yields a total redundancy margin of 81 LSBs. Large redundancy margins can be used to relax a larger comparator offset mismatch, which results in less comparator offset calibration overhead. Table 4 shows the allocation of this redundancy margin:

TABLE 4

Redundancy Allocation per Decision Cycle for Embodiment of FIG. 10

| | Bits per Decision Cycle 1-bit/cycle | | | | | | | | | |
|---|---|---|---|---|---|---|---|---|---|---|
| Noisy or Less Noisy [LSBs] | N | LN | N | LN | N | | LN | | | |
| Comparator Noise [LSBs] | 3 | 0.5 | 3 | 0.5 | 3 | 0 | 0 | 0 | 0 | 0 |
| DAC Settling [LSBs] | 24 | 10.5 | 4 | 2.5 | 1 | 2 | 2 | 0 | 0 | 0 |
| Offset Mismatch [LSBs] | 5 | 5 | 5 | 5 | 5 | — | — | — | — | — |
| Total Redundancy [LSBs] | 32 | 16 | 12 | 8 | 9 | 2 | 2 | 0 | 0 | 0 |

Figure 11:
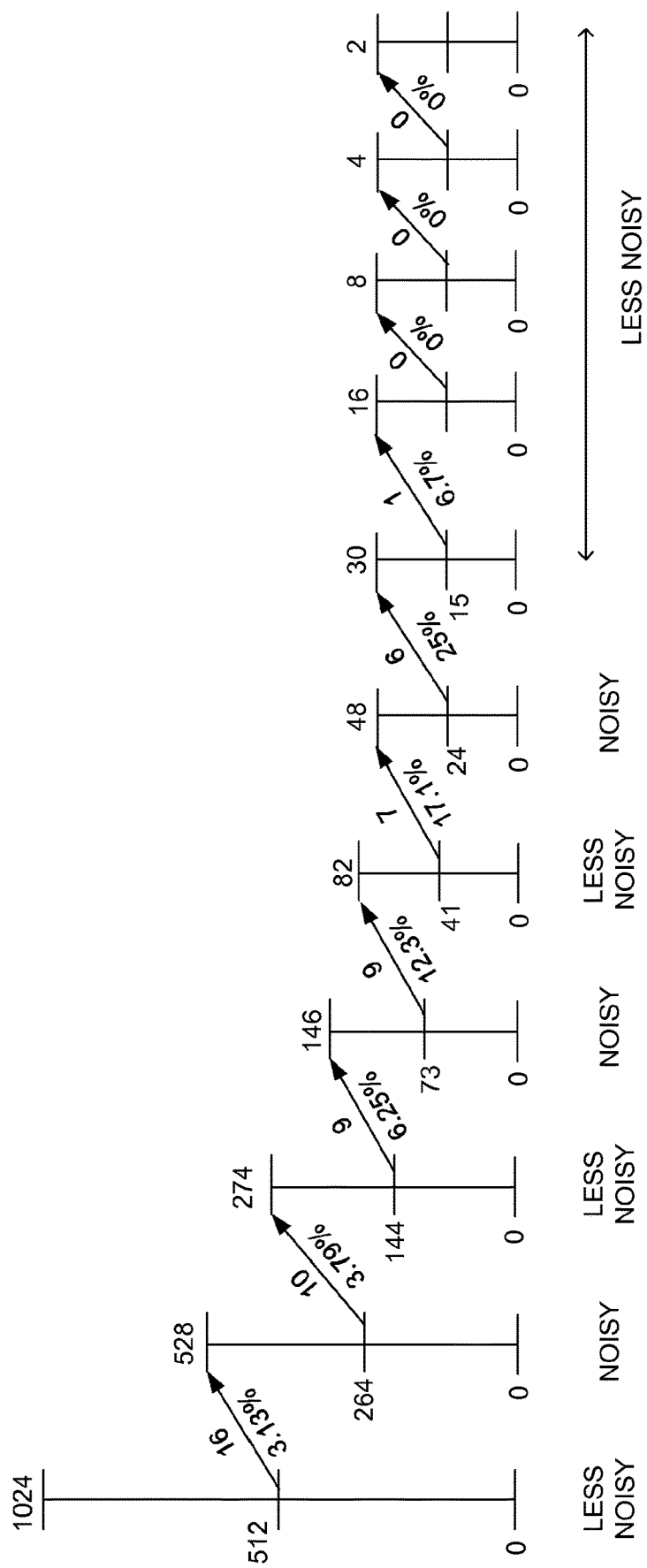
FIG. 11 is a range diagram of a SAR ADC performing only 1-bit decision cycles, and alternating comparator sets beginning with a less noisy comparator set.

Having an even number of alternating comparator decision cycles may require the use of a high precision comparator starting the first decision cycle, such that the transition to non-alternating comparator based LSB cycles uses a high precision comparator. FIG. 11 depicts one example of 1-bit/cycle decisions throughout, starting with a less noisy comparator. Since alternating comparators results in increasing the conversion speed, it could be beneficial to have smaller redundancy margin (however, this results in smaller offset mismatch allowance), such that more decision cycles use alternating comparators. The total redundancy margin in this design is 58 LSBs, which is considerably lower than the 81 LSBs in the embodiment of FIG. 10. The allocation of this redundancy is depicted in Table 5:

TABLE 5

Redundancy Allocation per Decision Cycle for Embodiment of FIG. 11

| | Bits per Decision Cycle 1-bit/cycle | | | | | | | | | |
|---|---|---|---|---|---|---|---|---|---|---|
| Noisy or Less Noisy | LN | N | LN | N | LN | N | | LN | | |
| Comparator Noise | 0.5 | 2 | 0.5 | 2 | 0.5 | 2 | 0 | 0 | 0 | 0 |
| DAC Settling | 12.5 | 5 | 5.5 | 4 | 3.5 | 1 | 1 | 0 | 0 | 0 |
| Offset Mismatch | 3 | 3 | 3 | 3 | 3 | 3 | — | — | — | — |
| Total Redundancy [LSBs] | 16 | 10 | 9 | 9 | 7 | 6 | 1 | 0 | 0 | 0 |

Figure 12:
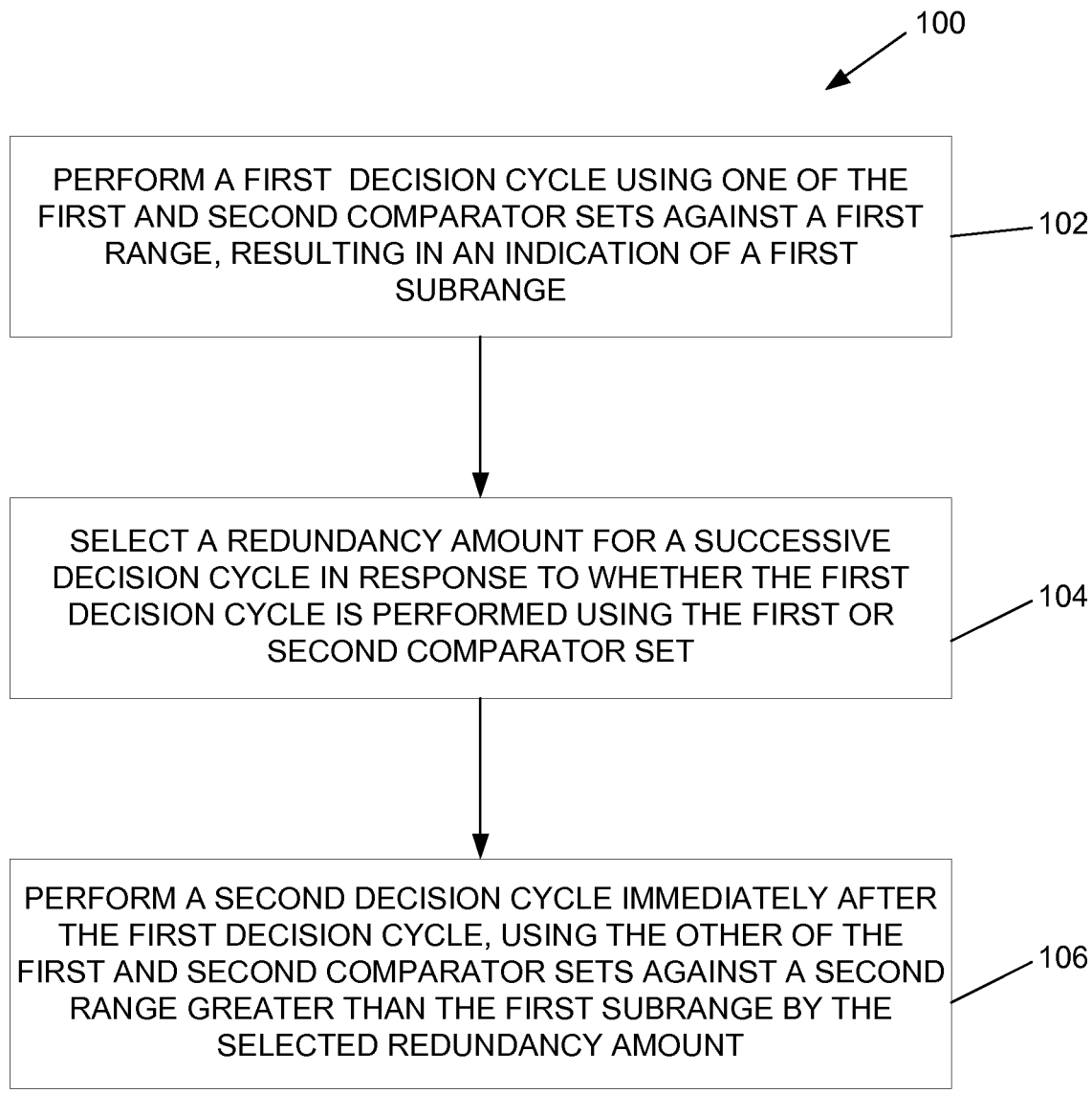
FIG. 12 is a flow diagram of a method of performing a SAR ADC process, using an inventive SAR ADC.

FIG. 12 depicts a method 100 of performing a SAR ADC process using a SAR ADC comprising a first m-bit comparator set comprising $2^m-1$ comparators, each having substantially the same first precision and first noise level. The SAR DAC further comprises a second m-bit comparator set comprising $2^m-1$ comparators, each having substantially the same second precision which is greater than the first precision, and second noise level which is lower than the first noise level. For each analog value conversion, a first m-bit decision cycle is performed using one of the first or second m-bit comparator sets against a first range, resulting in an indication of a first subrange (block 102). An immediately successive, second m-bit decision cycle is performed using the other of the first or second m-bit comparator sets against a second range greater than the first subrange by a redundancy amount (block 104). The redundancy amount is selected in response to whether the first m-bit decision was performed using the first or second m-bit comparator set.

FIG. 12 depicts a method 100 of performing a SAR ADC process, using a SAR ADC comprising a first comparator set, each comparator in the first comparator set having substantially a same first precision and first noise level. The SAR ADC further comprises a second comparator set, each comparator in the second comparator set having substantially a same second precision which is greater than the first precision, and second noise level which is lower than the first noise level. For each analog value conversion, a first decision cycle is performed using one of the first and second comparator sets against a first range, resulting in an indication of a first subrange (block 102). A redundancy amount for a successive decision cycle is selected in response to whether the first decision cycle is performed using the first or second comparator set (block 104). A second decision cycle is performed immediately after the first decision cycle, using the other of the first and second m-bit comparator sets against a second range greater than the first subrange by the selected redundancy amount (block 106).

Embodiments of the present invention present numerous advantages over SAR ADC approaches of the prior art. By alternating between noisy and less noisy comparator sets, the comparator reset time ($t_{reset}$) is removed from the critical path for at least some decision cycles, improving overall speed. The loss of accuracy in using noisy comparators is compensated by the uneven allocation of redundancy, in the form of LSBs of range for successive voltage comparisons, and the use of redundancy is compensated by adding decision cycles. SAR ADC speed is also improved by utilizing multi-bit decisions for early decision cycles, and reverting to 1-bit/cycle decision for the LSBs.

As used herein, the terms first and second are used for distinguishing between similar elements and do not necessarily imply a sequential or chronological order, or a definitive position within an ordered set. For example, an alternating pair of first and second sets of comparators may comprise the comparators used in the first and second decision cycles of a SAR ADC process, but they may alternatively comprise the second and third decision cycles, or any other two adjacent cycles within the process. Alternating between only less noisy comparators will yield an effective number of bits on par with the inventive approach, but at a lower speed. On the other hand, alternating between only noisy comparators will yield an effective number of bits worse than the inventive approach, but at a higher speed.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A method of performing a Successive Approximation Register (SAR) Analog to Digital Converter (ADC) process using a SAR ADC; the SAR ADC having a first comparator set and a second comparator set; each comparator in the first comparator set having substantially a same first precision and first noise level; each comparator in the second comparator set having substantially a same second precision which is greater than the first precision, and second noise level which is lower than the first noise level; the method comprising, for each analog value conversion:
   performing a first decision cycle using one of the first and second comparator sets against a first range, resulting in an indication of a first subrange;
   selecting a redundancy amount for a successive decision cycle in response to whether the first decision cycle is performed using the first or second comparator set; and
   performing a second decision cycle immediately after the first decision cycle, using the other of the first and second comparator sets against a second range greater than the first subrange by the selected redundancy amount.

2. The method of claim 1, wherein the selecting the redundancy amount for a successive decision cycle comprises selecting a greater redundancy amount if the first decision cycle is performed using the first comparator set than if the first decision cycle is performed using the second comparator set.

3. The method of claim 1, wherein the redundancy amount is selected to account for a Digital to Analog Converter (DAC) settling time, a comparator noise, a comparator kickback noise, and/or an offset mismatch between comparators.

4. The method of claim 1, wherein the one of the first comparator set and the second comparator set is an m-bit comparator set with $2^m-1$ comparators, and the other of the first comparator set and the second comparator set is a k-bit comparator set with $2^k-1$ comparators, where m≠k.

5. The method of claim 1, wherein the first comparator set and/or the second comparator set is an m-bit comparator set with $2^m-1$ comparators, where m is not an integer value.

6. The method of claim 1, wherein at least one of the sets of comparators forms a flash converter.

7. The method of claim 1, wherein the first decision cycle is performed using the first comparator set, and the second decision cycle is performed using the second comparator set.

8. The method of claim 1, further comprising performing a plurality of the last decision cycles in the ADC process using the second comparator set.

9. The method of claim 1, wherein a plurality of the last decision cycles in the ADC process are single-bit decision cycles.

10. The method of claim 1, wherein at least one decision cycle is added to the ADC process to accommodate the redundancy added to the range of the one or more decision cycles.

11. A Successive Approximation Register (SAR) Analog to Digital Converter (ADC), comprising:
   a first comparator set, each comparator in the first comparator set having substantially a same first precision and first noise level;
   a second comparator set, each comparator in the second comparator set having substantially a same second precision which is greater than the first precision, and second noise level which is lower than the first noise level; and
   SAR logic configured to:
      perform a first decision cycle using one of the first and second comparator sets against a first range, resulting in an indication of a first subrange;
      select a redundancy amount for a successive decision cycle in response to whether the first decision cycle is performed using the first or second comparator set; and
      perform a second decision cycle immediately after the first decision cycle, using the other of the first and second comparator sets against a second range greater than the first subrange by the selected redundancy amount.

12. The SAR ADC of claim 11, wherein the SAR logic is configured to select a redundancy amount for a successive decision cycle by selecting a greater redundancy amount if the first decision cycle is performed using the first comparator set than if the first decision cycle is performed using the second comparator set.

13. The SAR ADC of claim 11, wherein the SAR logic is further adapted to select the redundancy amount to account for a Digital to Analog Converter (DAC) settling time, a comparator noise, a comparator kickback noise, and/or an offset mismatch between comparators.

14. The SAR ADC of claim 11, wherein the one of the first comparator set and the second comparator set is an m-bit comparator set with $2^m-1$ comparators and the other of the first comparator set and the second comparator set is a k-bit comparator set with $2^k-1$ comparators, where m≠k.

15. The SAR ADC of claim 11, wherein at least one of the first comparator set and the second comparator set is an m-bit comparator set with $2^m-1$ comparators, where m is not an integer value.

16. The SAR ADC of claim 11, wherein at least one of the sets of comparators forms a flash converter.

17. The SAR ADC of claim 11, wherein the SAR logic is configured to perform the first decision cycle using the first comparator set, and to perform the second decision cycle using the second comparator set.

18. The SAR ADC of claim 11, wherein the SAR logic is configured to perform a plurality of the last decision cycles in the ADC process using the second comparator set.

19. The SAR ADC of claim 11, wherein a plurality of the last decision cycles in the ADC process are single-bit decision cycles.

20. The SAR ADC of claim 11, wherein the SAR logic is configured to add at least one decision cycle to the ADC process to accommodate the redundancy added to the range of the one or more decision cycles.

\* \* \* \* \*